(12) United States Patent
Tian et al.

(10) Patent No.: US 11,914,011 B1
(45) Date of Patent: Feb. 27, 2024

(54) HANDHELD MAGNETIC PARTICLE IMAGING SYSTEM AND METHOD BASED ON FIELD FREE LINE ROTATION

(71) Applicant: Beijing University of Aeronautics and Astronautics, Beijing (CN)

(72) Inventors: Jie Tian, Beijing (CN); Bo Zhang, Beijing (CN); Haoran Zhang, Beijing (CN); Yu An, Beijing (CN)

(73) Assignee: Beijing University of Aeronautics and Astronautics, Beijing (CN)

( * ) Notice: Subject to any disclaimer, the term of this patent is extended or adjusted under 35 U.S.C. 154(b) by 0 days.

(21) Appl. No.: 18/497,989

(22) Filed: Oct. 30, 2023

(30) Foreign Application Priority Data

Feb. 13, 2023 (CN) .......................... 202310106145.9

(51) Int. Cl.
*G01R 33/383* (2006.01)
*G01R 33/385* (2006.01)
*G01R 33/12* (2006.01)

(52) U.S. Cl.
CPC ..... *G01R 33/3852* (2013.01); *G01R 33/1276* (2013.01); *G01R 33/383* (2013.01)

(58) Field of Classification Search
CPC ................ G01R 33/00; G01R 33/0035; G01R 33/0023; G01R 33/0017; G01R 31/3191; G01R 33/0358; G01R 33/0356; G01R 33/3852; G01R 33/1276; G01R 33/383; G01B 7/004; G01C 17/38; G06F 3/017; G06F 3/0346; G06F 3/012; H01L 39/223
See application file for complete search history.

(56) References Cited

U.S. PATENT DOCUMENTS

2017/0067972 A1* 3/2017 Diamond ........... G01R 33/1276

FOREIGN PATENT DOCUMENTS

| CN | 114521881 A | 5/2022 | |
| WO | 2022019835 A1 | 1/2022 | |
| WO | WO-2022019835 A1 * | 1/2022 | ........... A61B 5/0035 |

* cited by examiner

*Primary Examiner* — Jermele M Hollington
*Assistant Examiner* — Taqi R Nasir
(74) *Attorney, Agent, or Firm* — Bayramoglu Law Offices LLC

(57) ABSTRACT

A handheld MPI system and method based on field free line (FFL) rotation is provided. The handheld MPI system includes: a gradient module configured to construct a gradient field with an FFL; a cooling module configured to cool the gradient module; an excitation module configured to excite magnetic particles in a region of the FFL; a detection module configured to receive an excitation response signal of the magnetic particles and counteract an excitation signal directly induced by a reception coil; a rotation module configured to control the gradient module and the cooling module to rotate around an axis of an excitation coil; a control and signal processing module configured to control each module to operate as needed, and process a received magnetic particle induction signal; and an image reconstruction module configured to reconstruct a magnetic particle distribution into a two-dimensional image.

16 Claims, 3 Drawing Sheets

HANDHELD MAGNETIC PARTICLE IMAGING SYSTEM AND METHOD BASED ON FIELD FREE LINE ROTATION

CROSS REFERENCE TO THE RELATED APPLICATIONS

This application is based upon and claims priority to Chinese Patent Application No. 202310106145.9, filed on Feb. 13, 2023, the entire contents of which are incorporated herein by reference.

TECHNICAL FIELD

The present disclosure belongs to the field of magnetic particle imaging (MPI), and in particular relates to a handheld MPI system and method based on field free line (FFL) rotation.

BACKGROUND

Magnetic particle imaging (MPI) is a new type of tracer-based tomography that can detect superparamagnetic iron oxide (SPIO) nanoparticles in a region and complete the imaging of spatial particle concentration distribution. MPI has the advantages of safety, no radiation, high contrast, high resolution, high sensitivity, and quantitative detection. MPI is now rapidly developing in many clinical applications, and has broad application prospects in medical fields such as angiography, cell tracking, oncology and others.

According to the working principle of MPI, the existing MPI systems generally achieve the imaging purpose by constructing a field free region (FFR) for spatial encoding. The FFR mainly includes field free point (FFP) and field free line (FFL). Compared to FFP scanning imaging, FFL scanning imaging significantly improves the spatiotemporal resolution and sensitivity. It utilizes a highly sensitive coil to receive the magnetization response signal of magnetic nanoparticles in the FFL region and spatially encodes the FFL scanning trajectory to reconstruct an image of the spatial concentration distribution of the magnetic particles.

At present, medical imaging devices (such as computed tomography (CT) and magnetic resonance imaging (MM) devices) and existing MPI devices for clinical testing are mostly large-sized, enclosed, and fixed, which compromises portability in practical applications. In addition, the existing MPI devices still cannot achieve whole-body imaging. Therefore, the above large-sized enclosed devices and the existing MPI devices cannot meet the actual needs of certain special situations (such as real-time detection during surgery).

Therefore, it is highly desirable to develop a portable, fast, and unlimited (in both terms of space and application conditions) handheld MPI system and method in this research field.

SUMMARY

In order to solve the above-mentioned problem existing the prior art, that is, the existing magnetic particle imaging (MPI) devices have poor portability, limited imaging bore, and limited application, the present disclosure provides a handheld MPI system based on FFL rotation. The handheld MPI system includes a gradient module, a cooling module, an excitation module, a detection module, a rotation module, a control and signal processing module, and an image reconstruction module, where an imaging space of the handheld MPI system is single-sided; and the gradient module, the cooling module, the excitation module, the detection module and the rotation module are located on the other side of the imaging space;

the gradient module includes a runway-shaped coil and a strip-shaped permanent magnet; and the cooling module is wrapped on a surface of the runway-shaped coil;

the excitation module is located at a center of the gradient module; an axis of an excitation coil of the excitation module is perpendicular to a bottom surface of the gradient module; and one end of the excitation coil is coplanar with the bottom surface of the gradient module;

the detection module includes a reception coil and a compensation coil; and the detection module is fixed inside the excitation module and coaxial with the excitation coil;

the rotation module is configured to control the gradient module and the cooling module to rotate around the axis of the excitation coil simultaneously;

the control and signal processing module is configured to control each module in the system to operate as needed, process a received magnetic particle induction signal, and send the processed magnetic particle induction signal to the image reconstruction module; and the image reconstruction module is configured to reconstruct a magnetic particle distribution into a two-dimensional image based on the received processed magnetic particle induction signal.

In some preferred embodiments, the gradient module is configured to construct a gradient field with an FFL;

the gradient field with the FFL is configured to saturate magnetic nanoparticles far from the FFL, such that the saturated magnetic nanoparticles do not generate a signal;

a direct current is applied to the runway-shaped coil to generate a gradient field along an x-direction in a central region of the imaging space; and two sides of the runway-shaped coil in the x-direction are parallel, and two sides of the runway-shaped coil in a y-direction are semi-circular;

the strip-shaped permanent magnet is a permanent magnet patch with a thickness and a width each lower than a set threshold, and is configured to generate an FFL at a center of the gradient field; and the strip-shaped permanent magnet is located at a center of the runway-shaped coil in the x-direction and the y-direction, and at a bottom surface of the runway-shaped coil in a z-direction; and where the x-direction is a minor-axis direction of the runway-shaped coil, the y-direction is a major-axis direction of the runway-shaped coil, and the z-direction is an axial direction of the excitation coil and the reception coil.

In some preferred embodiments, a length of the FFL is greater than a diameter of the excitation coil.

In some preferred embodiments, the cooling module is a hollow non-metallic conduit;

a cooling liquid flows through the hollow non-metallic conduit, and the cooling liquid is configured to absorb heat emitted by the gradient module when a large current passes through the gradient module; and the cooling liquid circulates through a water pump for cooling.

In some preferred embodiments, the excitation module is a cylindrical uniform multi-turn coil applied with a high-frequency sinusoidal excitation current and is configured to excite magnetic particles in a region of the FFL.

In some preferred embodiments, the reception coil and the compensation coil of the detection module are symmetrically distributed inside the excitation coil;

the reception coil is located at a lower end of the detection module; and a bottom surface of the reception coil is coplanar with a bottom surface of the excitation coil to receive an excitation response signal of the magnetic particles; and the compensation coil is located at an upper end of the detection module and has a winding direction opposite to a winding direction of the reception coil; and an upper surface of the compensation coil is coplanar with an upper surface of the excitation coil to counteract an excitation signal directly induced by the reception coil.

In some preferred embodiments, the rotation module is connected to the gradient module and the cooling module; and the rotation module is configured to drive, through a motor, the gradient module and the cooling module to rotate around a z-axis in an x-y plane, such that the FFL is rotated around the z-axis in the imaging space, and the excitation module and the detection module scan a spatial distribution of the magnetic particles throughout the x-y plane.

In some preferred embodiments, the control and signal processing module is configured to control the gradient module, the cooling module, the excitation module, the detection module and the rotation module to operate according to set conditions and order, filter and amplify the detected magnetic particle induction signal, and send the processed magnetic particle induction signal to the image reconstruction module.

In some preferred embodiments, the image reconstruction module is configured to reconstruct, based on the processed magnetic particle induction signal, the two-dimensional image of the magnetic particles through a system matrix reconstruction method.

Another aspect of the present disclosure provides a handheld MPI method based on FFL rotation. The handheld MPI method based on FFL rotation is implemented through the above-mentioned handheld MPI system based on FFL rotation, and includes:

S10: inputting the direct current to the runway-shaped coil of the gradient module to generate the gradient field on a surface of the handheld MPI system; and generating, by combining the strip-shaped permanent magnet of the gradient module, the gradient field with the FFL in the vicinity of a surface of the excitation coil and the reception coil of the excitation module;

S20: inputting the high-frequency sinusoidal current to the excitation module to generate a high-frequency excitation field in a field of view of the handheld MPI system; and exciting magnetic particles in the FFL to generate a magnetization response voltage signal;

S30: filtering and amplifying, by the control and signal processing module, an induced particle signal, and performing fast Fourier transform on a time-domain signal to obtain a spectral sequence of the induced signal;

S40: operating the rotation module to simultaneously rotate the gradient system and the cooling system by a set angle, such that the FFL and the gradient field are rotated around the z-axis as a rotation center; and repeating steps S10 to S30 until the rotation module rotates in reverse back to an initial position after a 180° rotation scan; and S50: performing, by the image reconstruction module, centralized processing for all spectral sequences generated after 180° rotation scans of the rotation module to construct a system measurement matrix; and calculating, based on frequency-domain signals at different rotation angles, a spatial concentration distribution of the magnetic particles, thereby achieving reconstruction of the two-dimensional image of the magnetic particles.

The present disclosure has following beneficial effects:

(1) In the handheld MPI system based on FFL rotation in the present disclosure, the runway-shaped coil is combined with the slender and thin permanent magnet to generate the FFL of the handheld MPI device. The cooling module achieves constant-temperature and stable operation of the device. Under the design premise of the excitation module and the reception module, the rotation module is combined to achieve the spatial rotation of the FFL, thereby achieving the spatial encoding function of the handheld MPI device. The control and signal processing module and the image reconstruction module are combined to ultimately achieve two-dimensional imaging of magnetic particles.

(2) In the handheld MPI system based on FFL rotation in the present disclosure, the MPI is achieved under the premise of handheld type and miniaturization, with unlimited detection regions, high detection sensitivity, and detection portability. The present disclosure avoids prominent problems such as large volume, fixed device position, and closed detection bore in existing MPI devices. The present disclosure can achieve the detection process without moving the detected object, and can provide real-time imaging of specific regions of interest, with high portability.

BRIEF DESCRIPTION OF THE DRAWINGS

Other features, objectives and advantages of the present disclosure will become more apparent upon reading the detailed description of the non-restrictive embodiments with reference to the following drawings.

Figure 1:
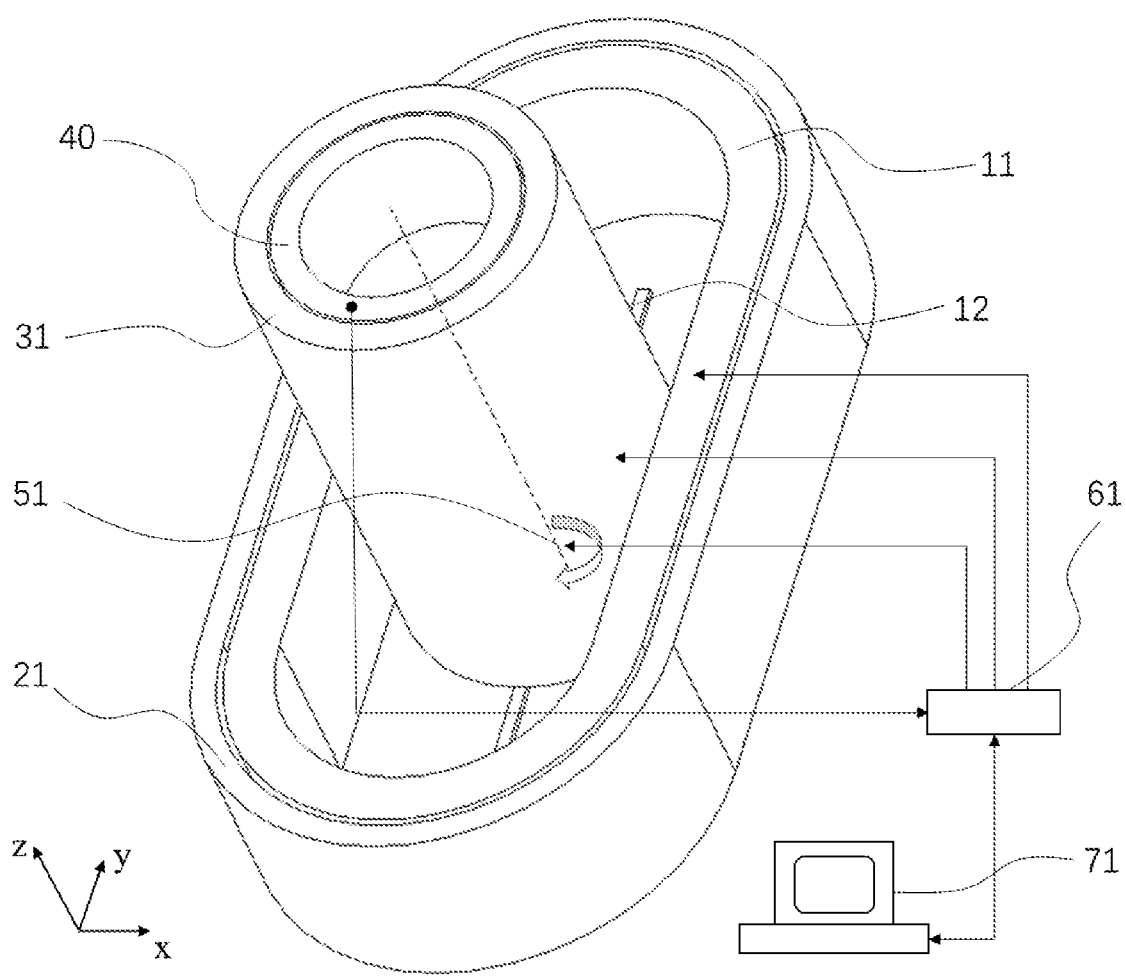
FIG. 1 is a structural diagram of a handheld magnetic particle imaging (MPI) system based on field free line (FFL) rotation according to the present disclosure.

REFERENCE NUMERALS 11. runway-shaped coil; 12. strip-shaped permanent magnet; 21. cooling module; 31. excitation module; 40. detection module; 41. reception coil; 42. compensation coil; 51. rotation module; 61. control and signal processing module; and 71. image reconstruction module.

DETAILED DESCRIPTION OF THE EMBODIMENTS

The present disclosure will be further described in detail below in conjunction with the drawings and embodiments. It should be understood that the specific embodiments described herein are merely intended to explain the present disclosure, rather than to limit the present disclosure. It should also be noted that, for convenience of description, only the parts related to the present disclosure are shown in the drawings.

It should be noted that the embodiments in the present disclosure and features in the embodiments may be combined with each other in a non-conflicting situation. The present disclosure will be described in detail below with reference to the drawings and embodiments.

The present disclosure provides a handheld MPI system based on FFL rotation. The handheld MPI system includes a gradient module, a cooling module, an excitation module, a detection module, a rotation module, a control and signal processing module, and an image reconstruction module.

An imaging space of the handheld MPI system is single-sided. The gradient module, the cooling module, the excitation module, the detection module and the rotation module are located on the other side of the imaging space.

The gradient module includes a runway-shaped coil and a strip-shaped permanent magnet. The cooling module is wrapped on a surface of the runway-shaped coil.

The excitation module is located at a center of the gradient module; an axis of an excitation coil of the excitation module is perpendicular to a bottom surface of the gradient module. One end of the excitation coil is coplanar with the bottom surface of the gradient module.

The detection module includes a reception coil and a compensation coil. The detection module is fixed inside the excitation module and coaxial with the excitation coil.

The rotation module is configured to control the gradient module and the cooling module to rotate around the axis of the excitation coil simultaneously.

The control and signal processing module is configured to control each module in the system to operate as needed, process a received magnetic particle induction signal, and send the processed magnetic particle induction signal to the image reconstruction module.

The image reconstruction module is configured to reconstruct a magnetic particle distribution into a two-dimensional image based on the received processed magnetic particle induction signal.

To more clearly explain the handheld MPI system based on FFL rotation in the present disclosure, modules in the embodiments of the present disclosure are described in detail below with reference to the FIG. 1.

In a first embodiment of the present disclosure, the handheld MPI system based on FFL rotation includes a gradient module, a cooling module, an excitation module, a detection module, a rotation module, a control and signal processing module, and an image reconstruction module. These modules are described in detail below.

Figure 2:
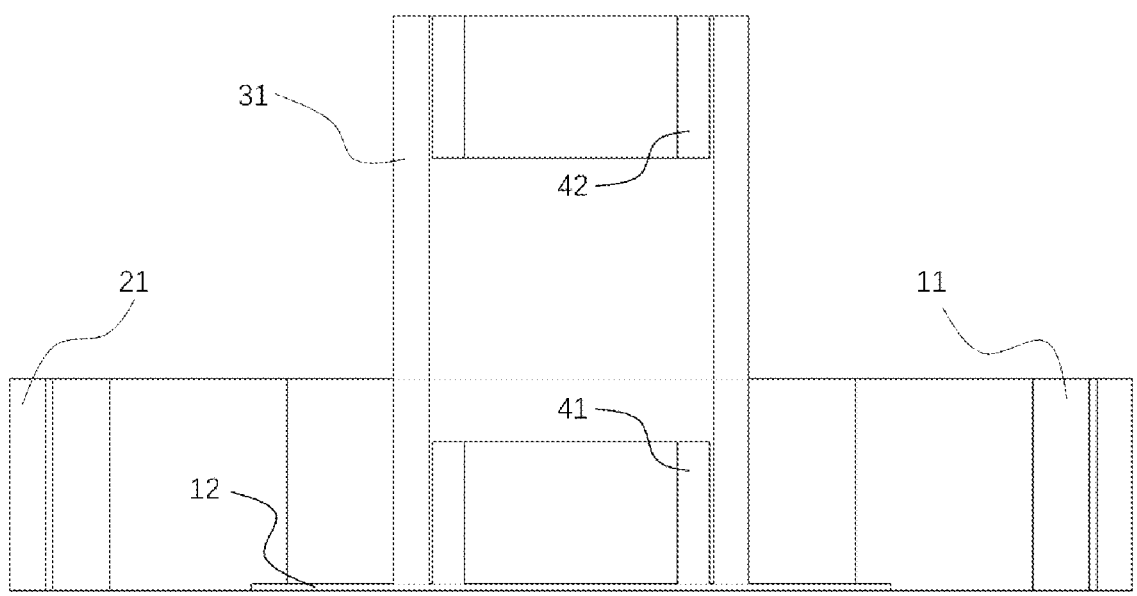
FIG. 2 is a sectional view of the handheld MPI system based on FFL rotation according to the present disclosure.

FIGS. 1 and 2 are respectively a structural diagram and a sectional view of the handheld MPI system based on FFL rotation according to the present disclosure. An imaging space of the handheld MPI system is single-sided. The gradient module, the cooling module, the excitation module, the detection module and the rotation module are located on the other side of the imaging space. The modules of the handheld MPI system based on FFL rotation have the following relationship. The gradient module includes a runway-shaped coil and a strip-shaped permanent magnet. The cooling module is wrapped on a surface of the runway-shaped coil. The excitation module is located at a center of the gradient module. An axis of the excitation coil is perpendicular to a bottom surface of the gradient module. One end of the excitation coil is coplanar with the bottom surface of the gradient module. The detection module includes a reception coil and a compensation coil. The detection module is fixed inside the excitation module and coaxial with the excitation coil. The rotation module is configured to drive the gradient module and the cooling module to rotate around a z-axis (also an axis of the excitation coil and the detection system).

These modules are fixedly connected to each other through non-metallic connecting components. The coil related modules, the control and signal processing module, and the image reconstruction module are connected through a twisted pair or a bayonet nut connector (BNC) connection line.

The gradient module includes a runway-shaped coil and a strip-shaped permanent magnet.

The gradient field with the FFL is configured to saturate magnetic nanoparticles far from the FFL, such that the saturated magnetic nanoparticles do not generate a signal.

A direct current is applied to the runway-shaped coil to generate a gradient field along an x-direction in a central region of the imaging space. Two sides of the runway-shaped coil in the x-direction are parallel, and two sides of the runway-shaped coil in a y-direction are semi-circular.

The strip-shaped permanent magnet is a (slender and thin) permanent magnet patch with a thickness and a width each lower than a set threshold, and is configured to generate an FFL at a center of the gradient field. The strip-shaped permanent magnet is located at a center of the runway-shaped coil in the x-direction and the y-direction, and at a bottom surface of the runway-shaped coil in a z-direction.

The x-direction is a minor-axis direction of the runway-shaped coil, the y-direction is a major-axis direction of the runway-shaped coil, and the z-direction is an axial direction of the excitation coil and the reception coil.

In order to ensure the uniformity of the gradient field and FFL in the imaging region, a length of the FFL generated by the gradient module is greater than a diameter of the excitation coil. Therefore, the length of both the runway-shaped coil and the strip-shaped permanent magnet is greater than the diameter of the excitation coil.

The cooling module is wrapped on a surface of the runway-shaped coil.

The cooling module is a hollow non-metallic conduit. A cooling liquid flows through the hollow non-metallic conduit. The cooling liquid is configured to absorb heat emitted by the gradient module when a large current passes through the gradient module. The cooling liquid circulates through a water pump for cooling.

In order to stably generate the gradient field and the FFL, it is necessary to apply a high-ampere direct current to the runway-shaped coil for a long time, but this will cause the system to heat up and introduce unstable factors and signal interference. In the present disclosure, a cooling liquid is introduced into a hollow non-metallic conduit to absorb the heat generated by the gradient module when there is a large current passing through. The cooling liquid circulates for cooling through a water pump.

The excitation module is located at a center of the gradient module. An axis of an excitation coil of the excitation module is perpendicular to a bottom surface of the gradient module. One end of the excitation coil is coplanar with the bottom surface of the gradient module.

The excitation module is a cylindrical uniform multi-turn coil applied with a high-frequency sinusoidal excitation current and is configured to excite magnetic particles in a region of the FFL.

The excitation module can be a segmented uniform multi-turn coil in some cases. In practical applications, the excitation current waveform can be changed according to needs. In a system that does not use a specific-frequency notch filter, the high-frequency excitation current applied to the excitation module can be a triangular wave, trapezoidal wave, or square wave, etc.

The detection module includes a reception coil and a compensation coil. The detection module is fixed inside the excitation module and coaxial with the excitation coil. The reception coil and the compensation coil of the detection module are symmetrically distributed inside the excitation coil.

The reception coil is located at a lower end of the detection module. A bottom surface of the reception coil is coplanar with a bottom surface of the excitation coil to receive an excitation response signal of the magnetic particles.

The compensation coil is located at an upper end of the detection module. A winding direction of the compensation coil is opposite to a winding direction of the reception coil. An upper surface of the compensation coil is coplanar with an upper surface of the excitation coil to counteract an excitation signal directly induced by the reception coil.

The function of the compensation coil is to counteract the high-intensity excitation signal directly induced by the reception coil, so the signal is much larger than the actual particle signal induced by the reception coil. Therefore, the compensation coil is symmetrically distributed inside the excitation coil and the reception coil to ensure that the excitation signals directly induced by the excitation coil and the reception coil have the same intensity. The method of opposite winding and then series connection can greatly counteract the directly induced signal.

The rotation module is connected to the gradient module and the cooling module to control the gradient module and the cooling module to rotate around the axis of the excitation coil simultaneously.

The rotation module is configured to drive, through a motor, the gradient module and the cooling module to rotate around a z-axis in an x-y plane, such that the FFL is rotated around the z-axis in the imaging space, and the excitation module and the detection module operate normally to scan a spatial distribution of the magnetic particles throughout the x-y plane. Here, the excitation module and the detection module operate normally without the need for rotation. Through the simultaneous operation, the spatial distribution of the magnetic particles throughout the x-y plane is ultimately scanned.

During the rotation of the gradient module and the cooling module, other modules of the system do not rotate together. The gradient module and the cooling module move relative to the detected object, while the excitation module and the reception module remain stationary relative to the detected object. The movement range of the FFL covers the entire imaging region.

It should be noted that in the handheld MPI system based on FFL rotation in the present disclosure, the rotation module drives the excitation module and the cooling module to rotate simultaneously to complete the scanning process. Due to the presence of structures such as circuits and cooling hoses, the rotation module and the cooling module need to rotate in reverse to the initial detection position after completing the rotation scan detection.

In the handheld MPI system based on FFL rotation in the present disclosure, in a specific implementation, as shown in FIG. 1, the system has a symmetrical structure. The rotation is performed with the corresponding position of the current structure as an initial position, with a fixed angle as a minimum step size for each rotation. The minimum angle of rotation determines some parameters of the system, such as image resolution and time resolution, which can be adjusted according to actual needs. The FFL is rotated 180° from its initial position to cover the entire imaging region, thereby completing the entire rotation scan process. Of course, the FFL can also be rotated 360° from the initial position to cover the entire imaging region. This requires a comprehensive consideration of imaging time and image reconstruction quality, and is not limited herein.

The control and signal processing module is configured to control each module in the system to operate as needed, process a received magnetic particle induction signal, and send the processed magnetic particle induction signal to the image reconstruction module.

The control and signal processing module is configured to control the gradient module, the cooling module, the excitation module, the detection module and the rotation module to operate according to set conditions and order, filter and amplify the detected magnetic particle induction signal, and send the processed magnetic particle induction signal to the image reconstruction module.

In the handheld MPI system based on FFL rotation in the present disclosure, in a specific implementation, the control and signal processing module is configured to control the other modules to operate according to needs and order, filter and amplify the detected magnetic particle induction signal, and send the processed magnetic particle induction signal to the image reconstruction module.

The image reconstruction module is configured to reconstruct a magnetic particle distribution into a two-dimensional image based on the received processed magnetic particle induction signal.

The image reconstruction module is configured to reconstruct, based on the processed magnetic particle induction signal, the two-dimensional image of the magnetic particles through a system matrix reconstruction method.

In the handheld MPI system based on FFL rotation in the present disclosure, in a specific implementation, the control and signal processing module is connected to the detection module and is sequentially connected to a notch filter, a low-pass filter, a signal amplifier, and an analog/digital (A/D) converter. The notch frequency of the notch filter is the same as the frequency of the high-frequency excitation sinusoidal current. The notch filter is configured to filter out a signal with the same frequency as the excitation signal, and together with the compensation coil, it ensures that the received signal is a particle signal while increasing the upper limit of the system's particle signal amplification. The low-pass filter is configured to filter out a high-frequency useless signal in the received signal spectrum and improve the signal-to-noise ratio in the available frequency band. The signal amplifier is configured to amplify the particle induction signal so as to enhance the signal-to-noise ratio of useful signal. The A/D converter is configured to convert the signal and output a digital signal to a computer for post-processing and image reconstruction.

When the excitation current is non-sinusoidal, no notch filter is used.

The image reconstruction module reconstructs the two-dimensional image of the magnetic particles based on the processed signal according to the principle of system matrix reconstruction. In a specific implementation, it is necessary to divide the imaging space into multiple small regions and place a small number of magnetic nanoparticles models in all the small regions of the imaging space for measurement. The size of the magnetic particle model is determined by the expected imaging resolution. A higher resolution requires a smaller reconstruction module. The magnetic particle model needs to accurately cover all positions in the imaging space so as to form an accurate and comprehensive system matrix. The image reconstruction module performs image reconstruction based on a system matrix formed by measurement.

In a specific implementation, the reconstruction method is not limited to the system matrix reconstruction method, and other reconstruction methods can be used according to needs, which will not be detailed herein.

Figure 3:
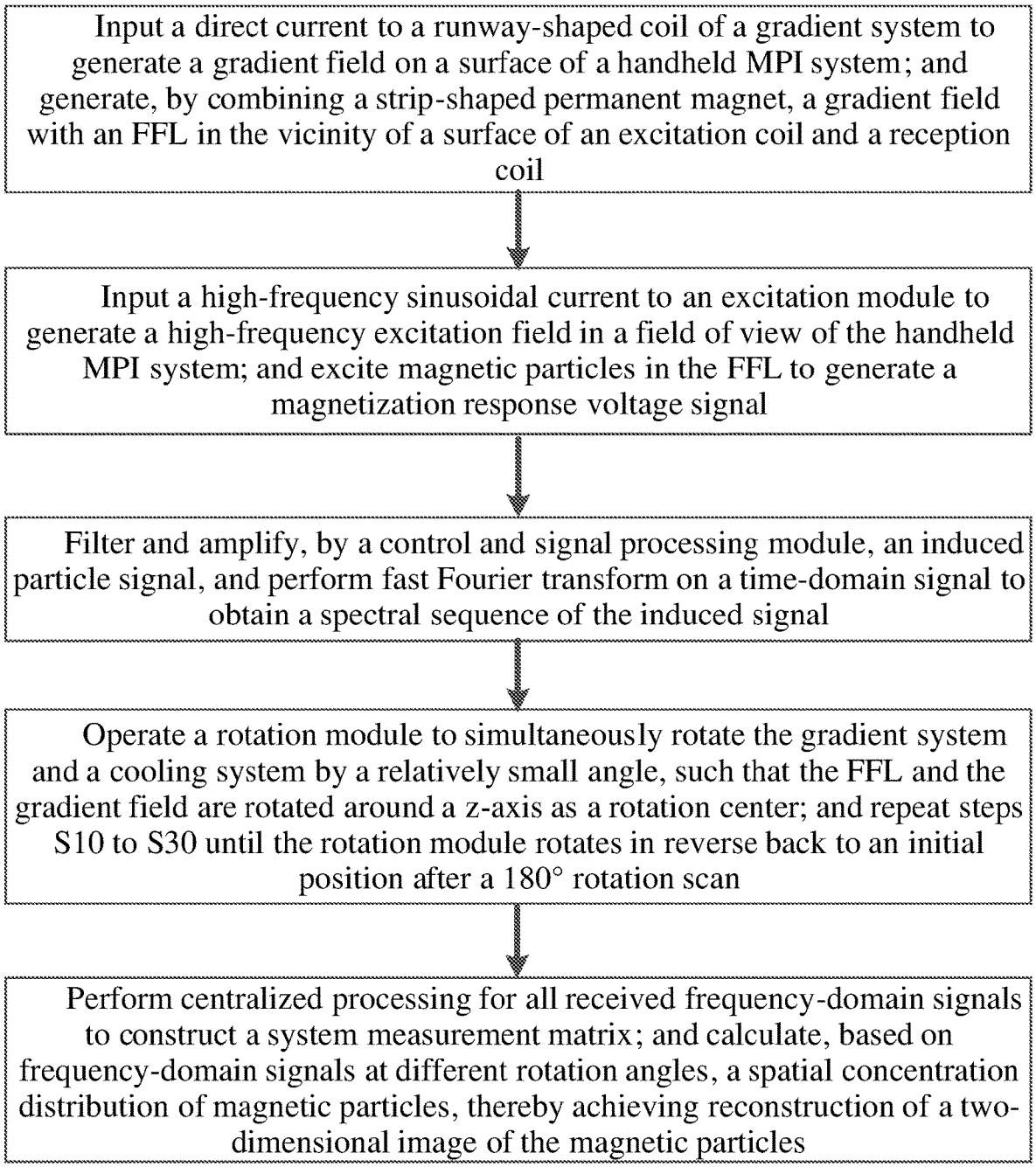
FIG. 3 is a flowchart of a handheld MPI method based on FFL rotation according to the present disclosure.

A second embodiment of the present disclosure provides a handheld MPI method based on FFL rotation. As shown in FIG. 3, the handheld MPI method based on FFL rotation is implemented through the above-mentioned handheld MPI system based on FFL rotation, and includes the following steps.

S10. The direct current is input to the runway-shaped coil of the gradient module to generate the gradient field on a surface of the handheld MPI system, and by combining the strip-shaped permanent magnet of the gradient module, the gradient field with the FFL is generated in the vicinity of a surface of the excitation coil and the reception coil of the excitation module.

S20. The high-frequency sinusoidal current is input to the excitation module to generate a high-frequency excitation field in a field of view of the handheld MPI system, and magnetic particles in the FFL are excited to generate a magnetization response voltage signal.

Under some special application conditions, in step S20, the high-frequency current input to the excitation module can have a non-sinusoidal waveform.

S30. The control and signal processing module filters and amplifies an induced particle signal, and performs fast Fourier transform on a time-domain signal to obtain a spectral sequence of the induced signal.

S40. The rotation module is operated to simultaneously rotate the gradient system and the cooling system by a set angle, such that the FFL and the gradient field are rotated around the z-axis as a rotation center. Steps S10 to S30 are repeated until the rotation module rotates in reverse back to an initial position after a 180° rotation scan.

In step S40, the angle of the completed rotation can be greater than 180°.

S50. The image reconstruction module performs centralized processing for all spectral sequences generated after 180° rotation scans of the rotation module to construct a system measurement matrix, and calculates, based on frequency-domain signals at different rotation angles, a spatial concentration distribution of the magnetic particles, thereby achieving reconstruction of the two-dimensional image of the magnetic particles.

In step S50, the principle of system matrix image reconstruction is expressed by u=Sc, where u denotes the system matrix formed by measurement, S denotes an actual measurement matrix of the detected object, and c denotes the spatial concentration distribution of the magnetic particles. Through u and S, c is calculated, thereby acquiring the spatial concentration distribution of the magnetic particles.

In step S50, the premise of the image reconstruction method is to construct an accurate and stable system matrix covering the entire imaging space. This step is not limited to the system matrix reconstruction method, and other reconstruction methods can be used as needed, which will not be detailed herein.

In the handheld MPI system and method based on FFL rotation in the present disclosure, the runway-shaped coil is combined with the slender and thin permanent magnet to generate the FFL of the handheld MPI device. The cooling module achieves constant-temperature and stable operation of the device. Under the design premise of the excitation module and the reception module, the rotation module is combined to achieve the spatial rotation of the FFL, thereby achieving the spatial encoding function of the handheld MPI device. The control and signal processing module and the image reconstruction module are combined to ultimately achieve two-dimensional imaging of magnetic particles. In the handheld MPI system and method based on FFL rotation in the present disclosure, the MPI is achieved under the premise of handheld type and miniaturization, with unlimited detection regions, high detection sensitivity, and detection portability. The present disclosure avoids prominent problems such as large volume, fixed device position, and closed detection bore in existing MPI devices. The present disclosure can achieve the detection process without moving the detected object, and can provide real-time imaging of specific regions of interest, with high portability.

Those skilled in the art can clearly understand that, for convenience and brevity of description, reference may be made to corresponding processes in the above system embodiments for specific working processes and related description of the method, and details are not described herein again.

It should be noted that the handheld MPI system and method based on FFL rotation in the above embodiments is only described by taking the division of the above functional modules as an example. In practical applications, the above functions can be completed by different functional modules as required, that is, the modules or steps in the embodiments of the present disclosure are further decomposed or combined. For example, the modules in the above embodiments may be combined into one module, or may be further divided into a plurality of sub-modules to complete all or part of the functions described above. The names of the modules and steps involved in the embodiments of the present disclosure are only for distinguishing each module or step, and should not be regarded as improper limitations on the present disclosure.

A device according to a third embodiment of the present disclosure includes:
    at least one processor; and
    a memory in communication connection with the at least one processor; and
    where, the memory stores instructions executable by the processor, and the processor is executed by the processor to implement the handheld MPI method based on FFL rotation.

A fourth embodiment of the present disclosure proposes a computer-readable storage medium, which stores a computer instruction, where the computer instruction is executed by a computer to implement the handheld MPI method based on FFL rotation.

Those skilled in the art should clearly understand that, for convenience and brevity of description, reference is made to corresponding processes in the above method embodiments for specific working processes and related description of the storage device and processing device, and details are not described herein again.

Those skilled in the art should be aware that the modules and method steps of the examples described in the embodiments disclosed herein may be implemented by electronic hardware, computer software or a combination thereof. The programs corresponding to software modules and method steps may be placed in random access memory (RAM), internal memory, read-only memory (ROM), electrically programmable ROM, electrically erasable programmable ROM, registers, hard disk, removable disk, compact disc read-only memory (CD-ROM), or in any other form of storage medium known in the technical field. In order to clearly illustrate the interchangeability of the electronic hardware and software, the composition and steps of each example are generally described in accordance with the function in the above description. Whether the functions are performed by electronic hardware or software depends on particular applications and design constraints of the technical solutions. Those skilled in the art may use different methods to implement the described functions for each specific application, but such implementation should not be considered to be beyond the scope of the present disclosure.

Terms such as "first" and "second" are intended to distinguish between similar objects, rather than describe or indicate a specific order or sequence.

Terms "include", "comprise" or any other variations thereof are intended to cover non-exclusive inclusions, so that a process, a method, an article, or a device/apparatus including a series of elements not only includes those elements, but also includes other elements that are not explicitly listed, or also includes inherent elements of the process, the method, the article or the device/apparatus.

The technical solutions of the present disclosure are described in the preferred implementations with reference to the drawings. Those skilled in the art should easily understand that the protection scope of the present disclosure is apparently not limited to these specific implementations. Those skilled in the art can make equivalent changes or substitutions to the relevant technical features without departing from the principles of the present disclosure, and the technical solutions derived by making these changes or substitutions should fall within the protection scope of the present disclosure.

What is claimed is:

1. A handheld magnetic particle imaging (MPI) system based on field free line (FFL) rotation, comprising a gradient module, a cooling module, an excitation module, a detection module, a rotation module, a control and signal processing module, and an image reconstruction module, wherein
   an imaging space of the handheld MPI system is single-sided; and the gradient module, the cooling module, the excitation module, the detection module and the rotation module are located on the other side of the imaging space;
   the gradient module comprises a runway-shaped coil and a strip-shaped permanent magnet; the cooling module is wrapped on a surface of the runway-shaped coil; and the gradient module is configured to construct a gradient field with an FFL;
   the gradient field with the FFL is configured to saturate magnetic nanoparticles far from the FFL, such that the saturated magnetic nanoparticles do not generate a signal;
   a direct current is applied to the runway-shaped coil to generate a gradient field along an x-direction in a central region of the imaging space; and two sides of the runway-shaped coil in the x-direction are parallel, and two sides of the runway-shaped coil in a y-direction are semi-circular;
   the strip-shaped permanent magnet is a permanent magnet patch with a thickness and a width each lower than a set threshold, and is configured to generate an FFL at a center of the gradient field; and the strip-shaped permanent magnet is located at a center of the runway-shaped coil in the x-direction and the y-direction, and at a bottom surface of the runway-shaped coil in a z-direction;
   wherein the x-direction is a minor-axis direction of the runway-shaped coil, the y-direction is a major-axis direction of the runway-shaped coil, and the z-direction is an axial direction of an excitation coil and a reception coil;
   the excitation module is located at a center of the gradient module; an axis of the excitation coil of the excitation module is perpendicular to a bottom surface of the gradient module; and one end of the excitation coil is coplanar with the bottom surface of the gradient module;
   the detection module comprises the reception coil and a compensation coil; and the detection module is fixed inside the excitation module and coaxial with the excitation coil;
   the rotation module is configured to control the gradient module and the cooling module to rotate around the axis of the excitation coil simultaneously;
   the control and signal processing module is configured to control each module in the system to operate as needed, process a received magnetic particle induction signal, and send the processed magnetic particle induction signal to the image reconstruction module; and
   the image reconstruction module is configured to reconstruct a magnetic particle distribution into a two-dimensional image based on the received processed magnetic particle induction signal.

2. The handheld MPI system based on FFL rotation according to claim 1, wherein a length of the FFL is greater than a diameter of the excitation coil.

3. The handheld MPI system based on FFL rotation according to claim 1, wherein the cooling module is a hollow non-metallic conduit;
   a cooling liquid flows through the hollow non-metallic conduit, and the cooling liquid is configured to absorb heat emitted by the gradient module when a large current passes through the gradient module; and
   the cooling liquid circulates through a water pump for cooling.

4. The handheld MPI system based on FFL rotation according to claim 1, wherein the excitation module is a cylindrical uniform multi-turn coil applied with a high-frequency sinusoidal excitation current and is configured to excite magnetic particles in a region of the FFL.

5. The handheld MPI system based on FFL rotation according to claim 1, wherein the reception coil and the compensation coil of the detection module are symmetrically distributed inside the excitation coil;
   the reception coil is located at a lower end of the detection module; and a bottom surface of the reception coil is coplanar with a bottom surface of the excitation coil to receive an excitation response signal of the magnetic particles; and
   the compensation coil is located at an upper end of the detection module and has a winding direction opposite to a winding direction of the reception coil; and an upper surface of the compensation coil is coplanar with an upper surface of the excitation coil to counteract an excitation signal directly induced by the reception coil.

6. The handheld MPI system based on FFL rotation according to claim 1, wherein the rotation module is connected to the gradient module and the cooling module; and
   the rotation module is configured to drive, through a motor, the gradient module and the cooling module to rotate around a z-axis in an x-y plane, such that the FFL is rotated around the z-axis in the imaging space, and the excitation module and the detection module scan a spatial distribution of the magnetic particles throughout the x-y plane.

7. The handheld MPI system based on FFL rotation according to claim 1, wherein the control and signal processing module is configured to control the gradient module, the cooling module, the excitation module, the detection module and the rotation module to operate according to set conditions and order, filter and amplify the detected magnetic particle induction signal, and send the processed magnetic particle induction signal to the image reconstruction module.

8. The handheld MPI system based on FFL rotation according to claim 1, wherein the image reconstruction module is configured to reconstruct, based on the processed magnetic particle induction signal, the two-dimensional image of the magnetic particles through a system matrix reconstruction method.

9. A handheld MPI method based on FFL rotation, implemented through the handheld MPI system based on FFL rotation according to claim 1, and comprising:
    S10: inputting the direct current to the runway-shaped coil of the gradient module to generate the gradient field on a surface of the handheld MPI system; and generating, by combining the strip-shaped permanent magnet of the gradient module, the gradient field with the FFL in a vicinity of a surface of the excitation coil and the reception coil of the excitation module;
    S20: inputting a high-frequency sinusoidal current to the excitation module to generate a high-frequency excitation field in a field of view of the handheld MPI system; and exciting magnetic particles in the FFL to generate a magnetization response voltage signal;
    S30: filtering and amplifying, by the control and signal processing module, an induced particle signal, and performing fast Fourier transform on a time-domain signal to obtain a spectral sequence of the induced signal;
    S40: operating the rotation module to simultaneously rotate the gradient system and the cooling system by a set angle, such that the FFL and the gradient field are rotated around the z-axis as a rotation center; and repeating steps S10 to S30 until the rotation module rotates in reverse back to an initial position after a 180° rotation scan; and
    S50: performing, by the image reconstruction module, centralized processing for all spectral sequences generated after 180° rotation scans of the rotation module to construct a system measurement matrix; and calculating, based on frequency-domain signals at different rotation angles, a spatial concentration distribution of the magnetic particles, thereby achieving reconstruction of the two-dimensional image of the magnetic particles.

10. The handheld MPI method based on FFL rotation according to claim 9, wherein in the handheld MPI system based on FFL rotation, a length of the FFL is greater than a diameter of the excitation coil.

11. The handheld MPI method based on FFL rotation according to claim 9, wherein in the handheld MPI system based on FFL rotation, the cooling module is a hollow non-metallic conduit;
    a cooling liquid flows through the hollow non-metallic conduit, and the cooling liquid is configured to absorb heat emitted by the gradient module when a large current passes through the gradient module; and
    the cooling liquid circulates through a water pump for cooling.

12. The handheld MPI method based on FFL rotation according to claim 9, wherein in the handheld MPI system based on FFL rotation, the excitation module is a cylindrical uniform multi-turn coil applied with a high-frequency sinusoidal excitation current and is configured to excite magnetic particles in a region of the FFL.

13. The handheld MPI method based on FFL rotation according to claim 9, wherein in the handheld MPI system based on FFL rotation, the reception coil and the compensation coil of the detection module are symmetrically distributed inside the excitation coil;
    the reception coil is located at a lower end of the detection module; and a bottom surface of the reception coil is coplanar with a bottom surface of the excitation coil to receive an excitation response signal of the magnetic particles; and
    the compensation coil is located at an upper end of the detection module and has a winding direction opposite to a winding direction of the reception coil; and an upper surface of the compensation coil is coplanar with an upper surface of the excitation coil to counteract an excitation signal directly induced by the reception coil.

14. The handheld MPI method based on FFL rotation according to claim 9, wherein in the handheld MPI system based on FFL rotation, the rotation module is connected to the gradient module and the cooling module; and
    the rotation module is configured to drive, through a motor, the gradient module and the cooling module to rotate around a z-axis in an x-y plane, such that the FFL is rotated around the z-axis in the imaging space, and the excitation module and the detection module scan a spatial distribution of the magnetic particles throughout the x-y plane.

15. The handheld MPI method based on FFL rotation according to claim 9, wherein in the handheld MPI system based on FFL rotation, the control and signal processing module is configured to control the gradient module, the cooling module, the excitation module, the detection module and the rotation module to operate according to set conditions and order, filter and amplify the detected magnetic particle induction signal, and send the processed magnetic particle induction signal to the image reconstruction module.

16. The handheld MPI method based on FFL rotation according to claim 9, wherein in the handheld MPI system based on FFL rotation, the image reconstruction module is configured to reconstruct, based on the processed magnetic particle induction signal, the two-dimensional image of the magnetic particles through a system matrix reconstruction method.

* * * * *